United States Patent [19]

Brunner et al.

[11] Patent Number: 5,675,164

[45] Date of Patent: Oct. 7, 1997

[54] HIGH PERFORMANCE MULTI-MESA FIELD EFFECT TRANSISTOR

[75] Inventors: Timothy A. Brunner, Ridgefield, Conn.; Louis L. Hsu, Fishkill; Jack A. Mandelman, Stormville, both of N.Y.; Li-Kong Wang, Montvale, N.J.

[73] Assignee: International Business Machines Corporation, Armonk, N.Y.

[21] Appl. No.: 486,221

[22] Filed: Jun. 7, 1995

[51] Int. Cl.$^6$ ............................................. H01L 29/78
[52] U.S. Cl. ..................... 257/331; 257/622; 257/401; 437/234; 437/50
[58] Field of Search ..................... 257/331, 332, 257/334, 336, 337, 622, 623, 327, 330, 401, 365; 437/234, 50

[56] References Cited

U.S. PATENT DOCUMENTS

| | | | |
|---|---|---|---|
| 3,905,036 | 9/1975 | Goronkin | 257/331 |
| 3,953,879 | 4/1976 | O'Connor-d'Arlach et al. | 257/331 |
| 3,982,264 | 9/1976 | Ishitani | 257/331 |
| 4,054,895 | 10/1977 | Ham | 257/331 |
| 4,379,001 | 4/1983 | Sakai et al. | 257/331 |
| 4,419,811 | 12/1983 | Rice | 257/331 |
| 4,503,598 | 3/1985 | Vora et al. | 29/571 |
| 4,625,388 | 12/1986 | Rice | 257/331 |
| 4,698,654 | 10/1987 | Kohn | 257/331 |
| 4,701,996 | 10/1987 | Calviello | 257/231 |
| 4,883,768 | 11/1989 | Swindal et al. | 257/331 |
| 4,975,754 | 12/1990 | Ishiuchi et al. | 257/331 |
| 4,988,637 | 1/1991 | Dhong et al. | 257/331 |
| 5,119,151 | 6/1992 | Onda | 257/331 |
| 5,177,028 | 1/1993 | Manning | 257/331 |
| 5,338,959 | 8/1994 | Kim et al. | 257/331 |
| 5,391,895 | 2/1995 | Dreifus | 257/331 |

FOREIGN PATENT DOCUMENTS

| | | | |
|---|---|---|---|
| 2-34936 | 2/1940 | Japan | 257/344 |
| 56-71974 | 6/1981 | Japan | 257/331 |
| 61-248563 | 11/1986 | Japan | 257/401 |
| 1-66966 | 3/1989 | Japan | 257/401 |
| 1-82672 | 3/1989 | Japan | 257/330 |
| 3-133143 | 4/1991 | Japan | 257/401 |
| 3-156976 | 7/1991 | Japan | 257/344 |
| 5-343679 | 12/1993 | Japan | 257/327 |

OTHER PUBLICATIONS

"Stand-by/Active Mode Logic for Sub-1 V 1G/4Gb DRAMs"; Daisaburo Takashima et al.; 1993 Symposium on VLSI Circuits; The Japan Society of Applied Physics and The IEEE Solid-State Circuits Council; pp. 83 & 84.

"Open/Folded Bit-Line Arrangement for ultra High-Density DRAMs"; Daisaburo Takashima et al.; ULSI Research Center, Toshiba Corporatiion; 1993 Symposium on VLSI Circuits; The Japan Society of Applied Physics and The IEEE Solid State Circuits Council; pp. 89 & 90.

IBM Technical Disclosure Bulletin; "Corner Enhance Field-Effect Transistor"; B.J. Machesney and J.A. Mandelman; vol. 34, No. 12, May 1992; pp. 101–102.

1992 Symposium On VLSI Circuits; Digest of Technical Papers; Japan Society of Applied Physics and The IEEE Solid-State Circuits Council; "Open/Folded Bit-Line Arrangement for Ultra High-Density DRAMs"; Daisaburo Takashima et al.; Toshiba Corporation; pp. 89–90.

*Primary Examiner*—Donald Monin
*Attorney, Agent, or Firm*—Whitham, Curtis, Whitham & McGinn; Susan M. Murray, Esq.

[57] ABSTRACT

A high performance transistor includes mesa structures in a conduction region, favoring corner conduction, together with lightly doped mesa structures and mid-gap gate material also favoring operation in a fully depleted mode. Mesa structures are formed at sub-lithographic size and pitch as recesses or by epitaxial growth together with exposure of a resist by an interference pattern generation with illuminating radiation and multiple exposures using a mask shifted by a sub-lithographic distance. For an NFET, conduction electron and hole distribution profiles in the mesa structures and gate capacitance are adjusted with dielectric thickness, including deposition of oxide from a liquid solution at room temperature. Transconductance may be altered by change of the aspect ratio of the mesa structures. Lightly doped drain structures are also formed at sub-lithographic sizes by self-aligned processes.

32 Claims, 12 Drawing Sheets

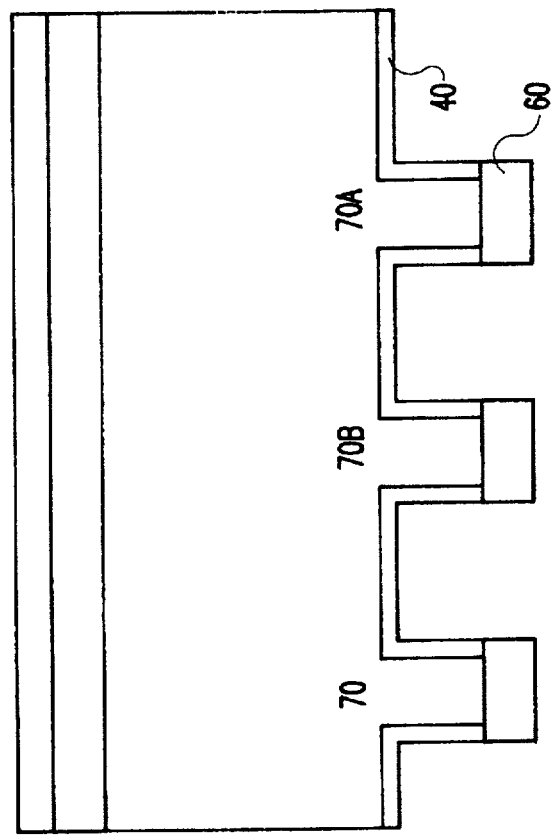
FIG.22B (X1 – X1')
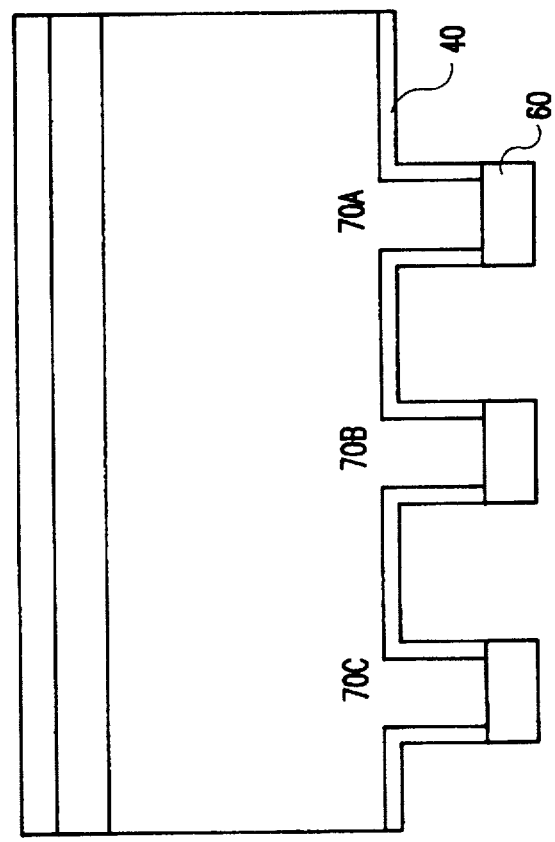
FIG.22C (X – X')

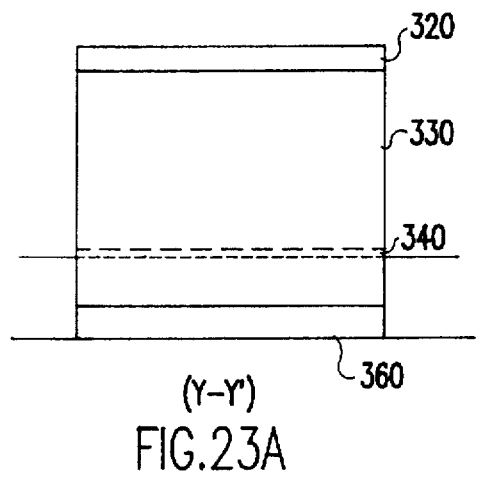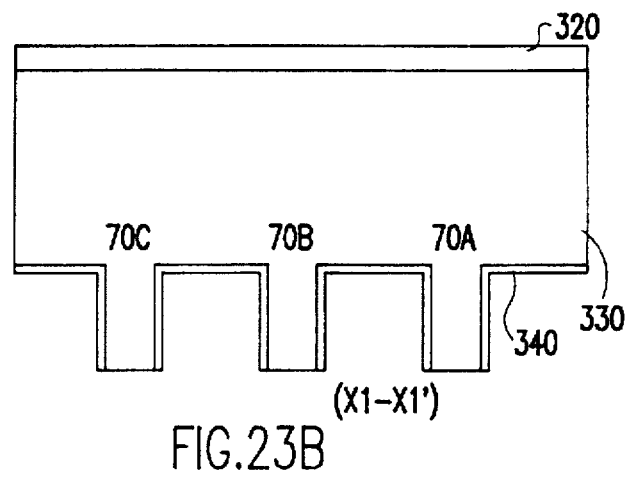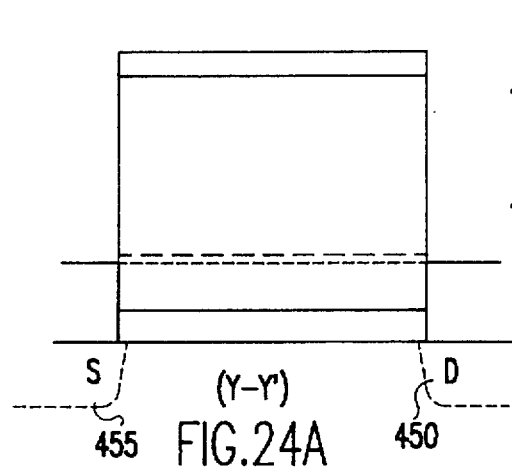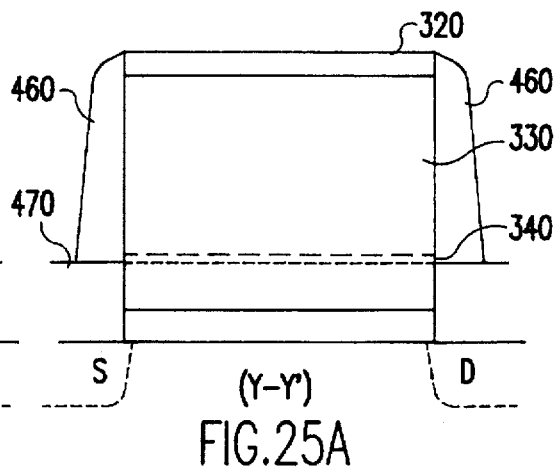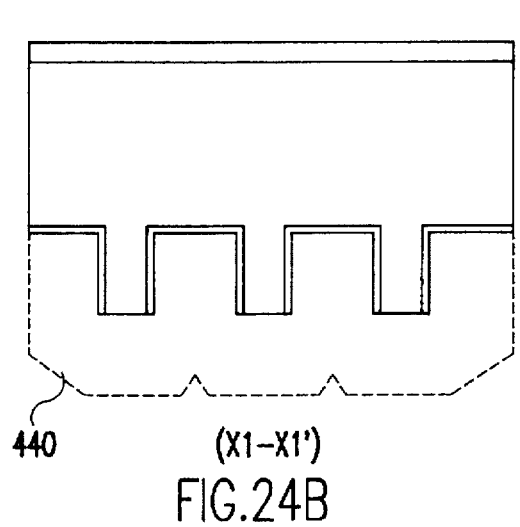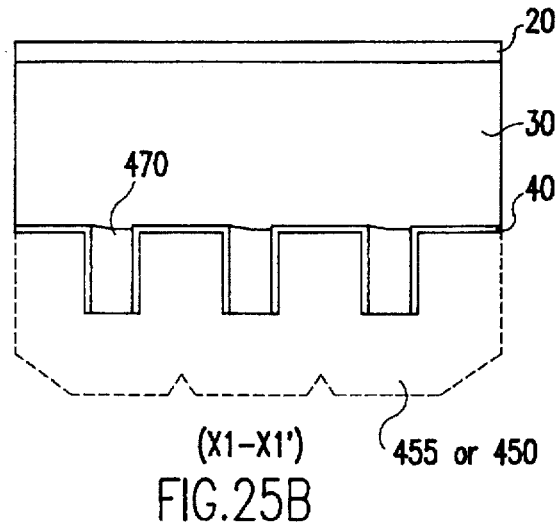

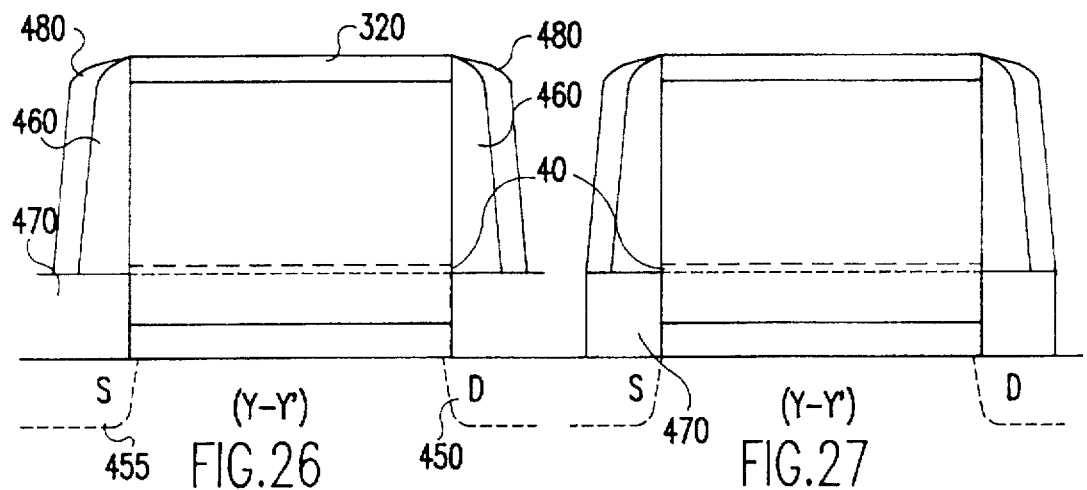
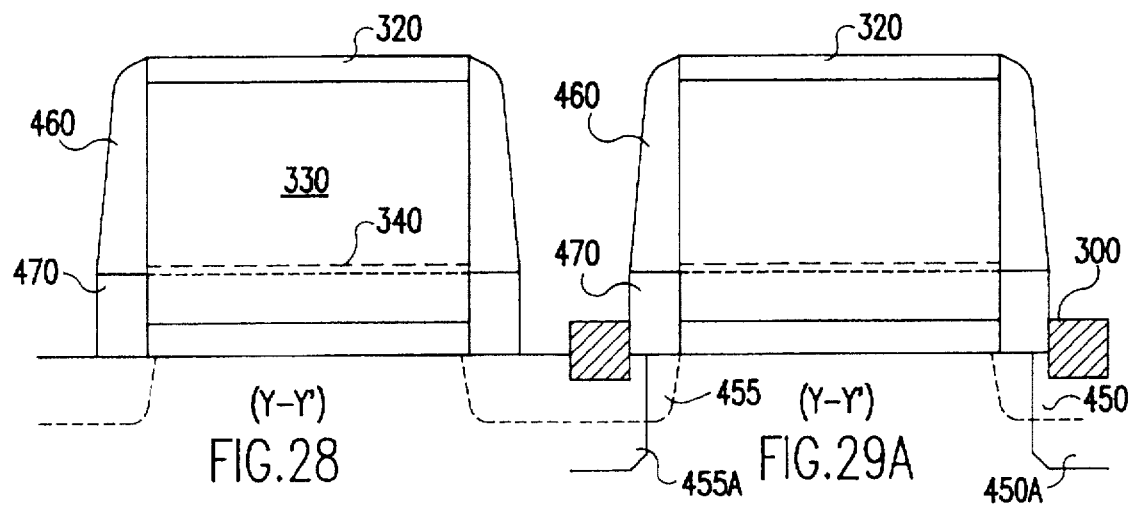
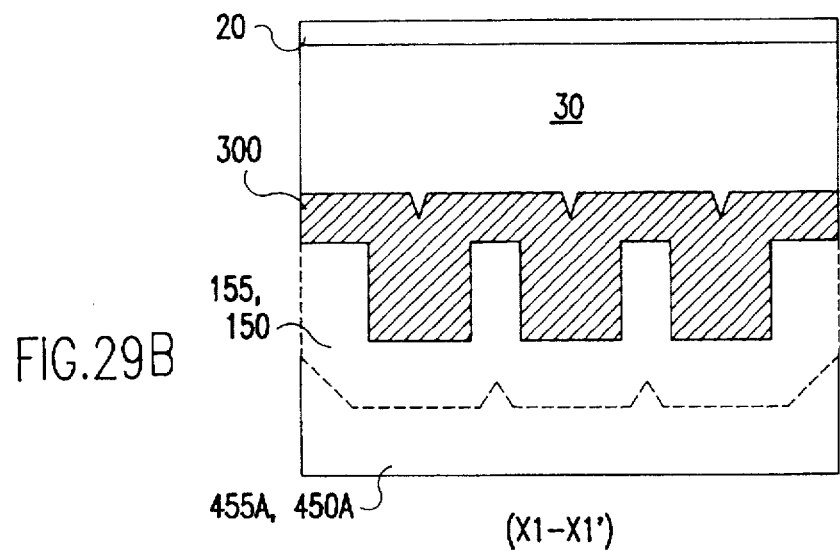

HIGH PERFORMANCE MULTI-MESA FIELD EFFECT TRANSISTOR

BACKGROUND OF THE INVENTION

1. Field of the Invention

The present invention generally relates to field effect transistors and, more particularly, to field effect transistor structures suitable for integration at extremely high density and capable of high conduction currents at low gate voltages.

2. Description of the Prior Art

Interest in increased integration density of integrated circuits is driven by the need for lower power dissipation, higher performance, increased circuit functionality and reduced fabrication cost. Power dissipation may be reduced by lower operating voltages, which requires that geometries be scaled down to achieve desired performance. As geometries are scaled down, conductor length and parasitic capacitance decrease, resulting in decreased signal propagation time. Furthermore, there are the economic benefits of reduced processing costs resulting from the formation of greater numbers of circuits on a single chip or wafer. However, as active devices are scaled to smaller physical dimensions, voltages must also be scaled back for reasons of reliability, including dielectric breakdown, hot carrier effects and heat dissipation. Thus, scalability of devices is constrained by the competing considerations of performance and reliability.

However, scaling of other types of devices to smaller sizes may have deleterious effects on performance, particularly when capacitive coupling effects are relied upon for device operability. Field effect transistors, which rely on alteration of conduction characteristics of a channel in a body of semiconductor material by a capacitively coupled electrical field, when scaled to extremely small lateral dimensions do not exhibit scalability of drive voltages and the conduction threshold voltage, Vt, in particular. In fact, it is quite difficult to avoid increase of Vt for a given off-current because the sub-threshold slope degrades with higher doping concentrations which are required to reduce short channel effects because of limits on minimum gate insulator thickness. Additionally, reduced size limits the gate voltage Vg which can be applied to the device without breakdown and the lack of scalability of Vt reduces the available overdrive voltage (Vg−Vt) with a consequent reduction of available on-current of the device. Therefore, present bulk CMOS technologies cannot be extended into very low voltage (e.g. Vdd<1.5 V) operating regimes.

To avoid this limitation on applicability of CMOS technologies, very low temperature operation and silicon-on-insulator structures have been proposed to reduce threshold voltage, Vt. However, the use of refrigeration imposes severe limitations on the possibility of application in portable devices and increases cost of operation. Additionally, problems of package reliability are often encountered in very low temperature operation which are often difficult and costly to solve. The use of SOI structures suffers from floating body effects and the cost of the SOI structure, itself, on which devices are to be formed.

Additionally, a very narrow channel MOSFET structure has been proposed in order to obtain improvement of sub-threshold slope and high conduction current, as described in IBM TDB Vol. 34, No. 12, pp. 101–102 (May, 1992) entitled "Corner enhanced Field-Effect Transistor" which exploited corner conduction effects, generally considered to be parasitic at unavoidable edges of the channel, which are made to dominate over conduction in the remainder of the channel. This principle was extended, as described therein, to a so-called multi-mesa structure by repeated conformal deposition and anisotropic etching of alternating layers of nitride and polysilicon which fill the area between shallow trench isolation structures and form a plurality of narrow channels extending from the source to the drain of the transistor. However, such repeated processing is extremely expensive and compromises manufacturing yields. Further, corner dominated conduction implies high levels of mesa doping to suppress conduction other than at the corners of the mesas. The device also suffers from disproportionately high gate/input capacitance since significant portions of the area of the gate do not correspond to regions which significantly contribute to the conduction of the device.

Another approach to a similar structure is disclosed in IBM TDB Vol. 34, No. 10A, (March, 1992), pp. 472–473, which describes etching slits into a channel formed on SOI or bulk semiconductor such that each slit essentially forms two back-to-back FETs with the thickness of the channel layer defining the channel width. However, the above-noted problems with SOI structures are not overcome by this structure and the slit and intervening channel size is limited by minimum feature sizes obtainable with current lithographic processes; limiting the minimum "footprint" such a transistor would occupy.

Accordingly, there is a need for a design for a field effect transistor which can be fabricated by low cost processes at extremely small size and at high integration density and is of high performance and exhibiting some degree of scalability of Vt while having good overdrive margins and high on-current, low off-current performance.

SUMMARY OF THE INVENTION

It is therefore an object of the present invention to provide a multi-mesa FET structure having sub-lithographic mesa widths and periodicity and methods of making the same.

It is another aspect of the invention to provide an FET structure which simultaneously exploits both mesa and corner conduction effects and methods of making the same.

It is a further object of the invention to provide a high performance FET structure having high on-current, low off-current, scalable Vt which can be closely controlled and extended overdrive operating margins and methods of making the same.

It is yet another object of the invention to provide an FET structure which has high performance and can be formed at extremely small size and high integration density by simple and relatively inexpensive processes and methods of making the same.

It is another further object of the invention to provide a plurality of semiconductor manufacturing processes which can produce features of sub-lithographic size in at least one direction while utilizing economical lithographic processes having good manufacturing yield.

In order to accomplish these and other objects of the invention, a field effect transistor is provided having a conduction region including a plurality of mesa structures formed at sub-lithographic width by etching and doped to an impurity concentration to operate in a fully depleted mode.

In accordance with another aspect of the invention, a method of making a field effect transistor is provided including the steps of exposing a pattern on lines on a lithographic resist having a pitch which is less than one-half micron, etching grooves of sub-lithographic width in accordance with the exposure of the resist, forming a grooved surface including mesa structures, forming an oxide on the grooved surface, and applying a gate electrode over the oxide.

In accordance with a further aspect of the invention, a semiconductor wafer is provided having a region of a surface patterned with a plurality of elongated features which have a width less than or equal to one-quarter micron and a pitch less than or equal to one-half micron.

In accordance with yet another aspect of the invention, a method of making a semiconductor wafer is provided including the steps of depositing a layer of material, depositing a resist over the material, making a first lithographic exposure of the resist through a lithographic mask, shifting the mask by a sub-lithographic distance, making a second lithographic exposure of the resist, and etching the layer of material in accordance with the first and second exposures.

BRIEF DESCRIPTION OF THE DRAWINGS

The foregoing and other objects, aspects and advantages will be better understood from the following detailed description of a preferred embodiment of the invention with reference to the drawings, in which:

FIGS. 22, 22A, 22B, 22C, 23A, 23B, 24A, 24B, 25A, 25B, 26, 27, 28, 29A and 29B illustrate a fabrication method for source and drain formation which are applicable to embodiments and variations of the invention described herein.

DETAILED DESCRIPTION OF A PREFERRED EMBODIMENT OF THE INVENTION

Figure 1:
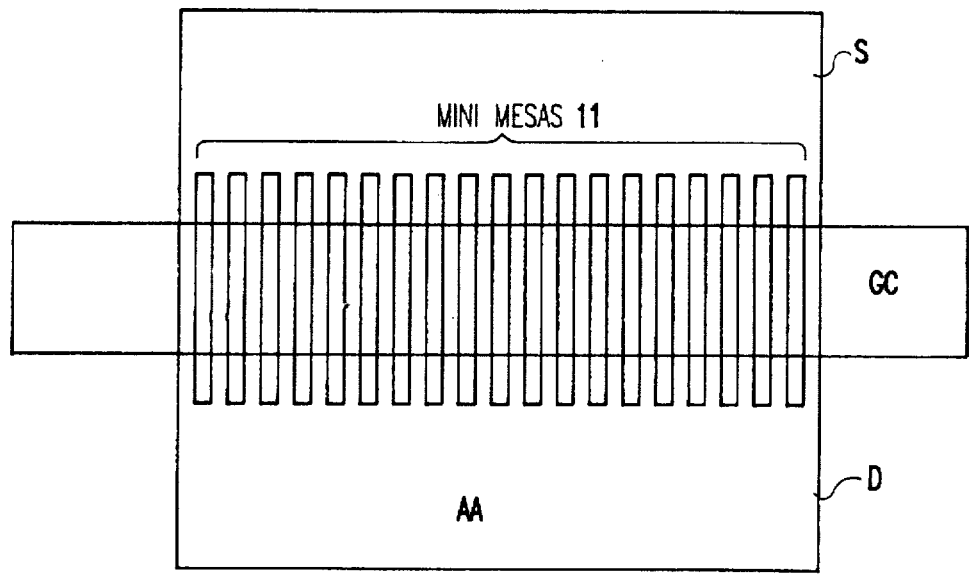
FIGS. 1, 2, 3 and 4 illustrate the general form of a multi-mesa FET in accordance with the invention.
Figure 2:
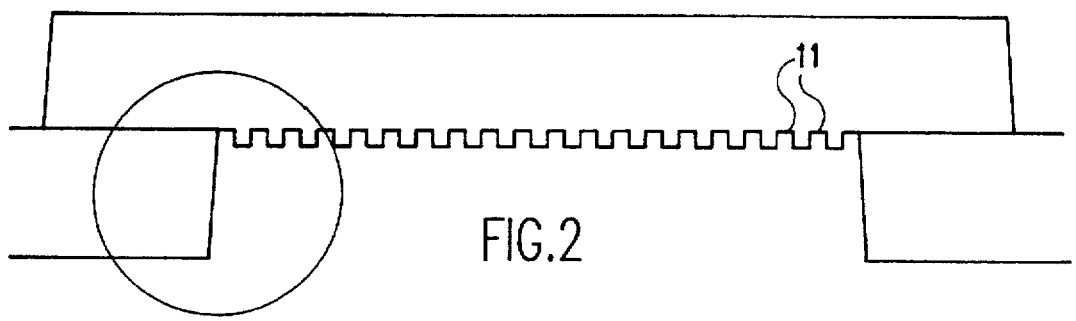

Referring now to the drawings, and more particularly to FIGS. 1–4, the overall structure of the invention is illustrated. The following decription assumes an NFET structure but is equally applicable to PFET structures. FIG. 1 shows a field effect transistor in accordance with the invention in plan view with the conduction region AA divided into a source region S and a drain region D separated by a band of mini-mesas 11 which, in this case, are formed as grooves in the conduction region AA. The mesas are more readily apparent in the cross-sectional view of FIG. 2. As will be described in greater detail in connection with various fabrication techniques, the mesas are very lightly doped (e.g. $10^{16}/cm^3$) in comparison with prior multi-mesa (MM) designs noted above in order to achieve full depletion of the mesa. Light mesa doping leads to strong inversion throughout the mesa. This contrasts with a mesa doping of $10^{18}/cm^3$ and an N+ poly gate for a reasonable Vt of about 400 mV and corner dominated conduction of prior designs. The gate electrode is preferably of a material having a work function near mid-band gap, such as tungsten, hereinafter referred to as a mid-gap material, to assure full depletion of the mesa cross-section and a low off-current.

Figure 3:
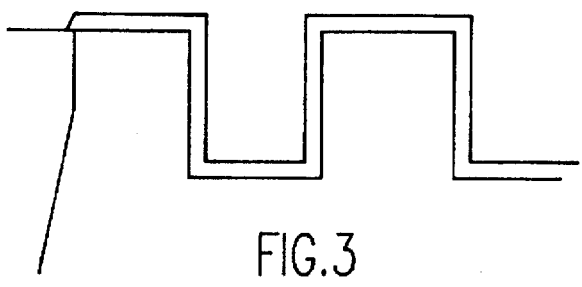
Figure 4:
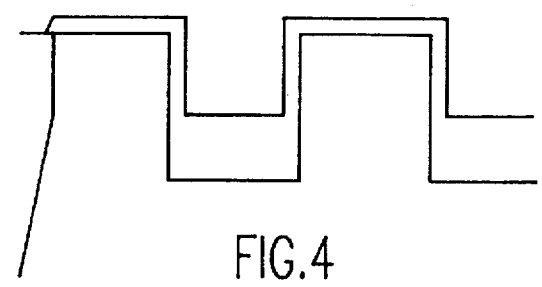

Details of the interface between the gate electrode and the conduction region are shown in FIGS. 3 and 4 including thin and thick gate insulators between the mesas, respectively. The difference between the two possibilities is the alteration of equal concentration profiles for electrons within the mesa, as will be understood by those skilled in the art in light of this description of the invention particularly in connection with FIG. 20 and the thickness of the insulator between the mesas may be adjusted accordingly. However, a thicker insulator such as is shown in FIG. 4 will provide somewhat reduced gate capacitance in comparison with thinner insulators between the mesas.

The key to formation of the structure of FIGS. 1–4 at small size and high integration density is the formation of the mesas or grooves separating them at small size and pitch. The pitches of interest are generally in the range of 50 nm–300 nm with mesa width of approximately one-half that dimension. However, it is expected that the advantages of the present invention will be even more pronounced at even smaller dimensions as may be achieved by processes which will be described herein and other techniques which may be developed. To this end and in accordance with one aspect of the invention, a plurality of processes employing lithography have been developed by the inventors.

Figure 5:
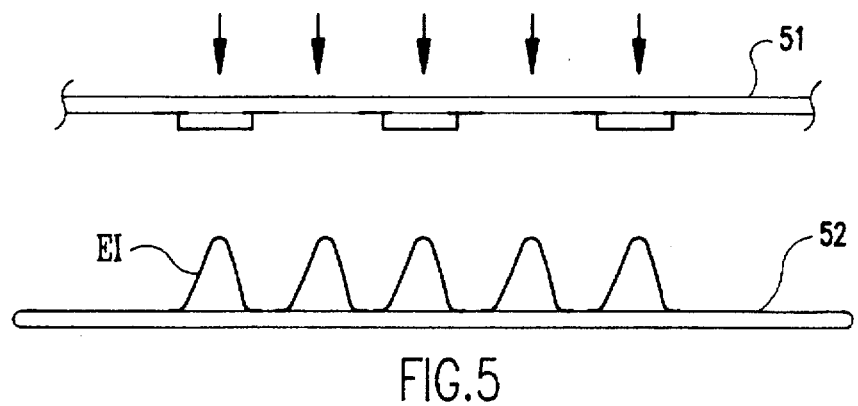
FIGS. 5, 6, 7, 8, 9 and 10 illustrate lithographic techniques for producing gratings having sub-lithographic feature widths and pitches.

FIG. 5 shows the use of a strong phase shift mask of the Levinson type 51 with illumination of a photoresist covering a blanket layer of oxide on a silicon wafer 52 from a single coherent monochromatic light source such as a laser. The term "strong", in this context, is generally understood to refer to the sharpness of image edges which can be produced. As used herein, the term is intended to additionally infer that the sharpness of the edges is sufficient to produce a feature of one-quarter micron size or smaller. For example, using 193 nm illumination, a strong phase shift mask can produce a line width of 0.14 microns or even less using a higher numerical aperture of the exposure tool. A chromeless phase shift mask (PSM) could also be used. The grating pattern of exposure allows resolution to be almost doubled compared to conventional photolithography and enables a grating pitch of 0.6 of the wavelength of the illuminating radiation. For commonly used photolithographic wavelengths, this method will provide a grating having a pitch of about 300 nm when the photoresist is developed and the oxide layer and a shallow depth of silicon are etched by suitable known methods. Best performance will be obtained when partial coherence is reduced below 0.3.

Figure 6:
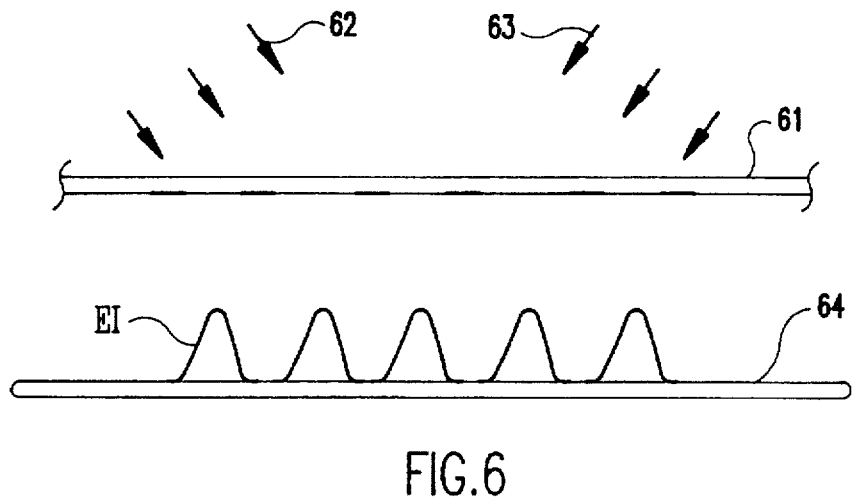

FIG. 6 illustrates the use of an ordinary chrome-on-glass reticle 61 with dipole illumination where two oblique beams 62, 63 are incident on the reticle to expose a photoresist covering an oxide layer on a silicon wafer 64 as in FIG. 5. In this case, the oblique angles of the beams provide relative phase shift and resolution of 0.6 of the wavelength of the illuminating radiation is possible, as in the case of the strong phase shift mask (PSM); again, potentially delivering pitches of 300 nm when the oxide and silicon are etched in accordance with the exposed and developed pattern of the photoresist and using common photolithographic wavelengths.

Figure 7:
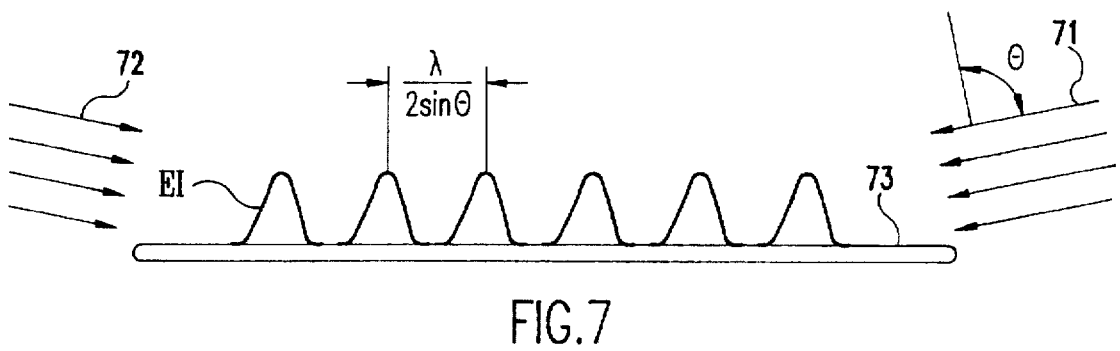

FIG. 7 illustrates interference lithography as is known for production of large area diffraction gratings. Applied to the fabrication of the mesas of the present invention, two separate coherent beams 71, 72 are incident on the conduction region (e.g. layer or substrate) 73 to be patterned at a shallow angle and produce a standing wave interference pattern. The pitch of the pattern is equal to the wavelength of the incident radiation divided by twice the sine of the angle of incidence of the illuminating radiation to a plane perpendicular to the exposed surface. Thus, the pitch can approach 0.5 times the wavelength as the incident radiation approaches a path parallel to the surface and pitches of 100 nm are possible.

The grating pitches obtainable with the above techniques are wavelength dependent and are thus capable of producing smaller grating pitches with the use of shorter wavelengths of radiation. It is generally desired to make the grating pitch as small as possible and a one-quarter micron mesa width is considered to be the upper limit for production of the dramatic performance improvements of a transistor in accordance with the invention, as will be discussed below. Therefore, exposure techniques allowing resolution at less than a wavelength of the exposure radiation, as discussed above are important to the practice of the invention and obtaining the benefits thereof. Thus pitches below 100 nm are obtainable with E-beam, X-ray and ion beam lithography and even Scanning Electron Microscope lithography and resists appropriate to the corresponding form of illuminating radiation. However, it should be understood that these shorter wavelengths of exposure radiation may not require the techniques of FIGS. 5–7 (or 8–10) to fabricate an operative embodiment of the invention. It should also be noted that since the light intensity is modulated in each of the above cases by the interference pattern developed, as shown at EI in each of FIGS. 5–7, the mesa width as a fraction of pitch can be adjusted by illumination intensity and/or duration (due to the response of the resist to the illuminating radiation) and is preferably determined empirically in accordance with the response of the resist used. Additionally, sub-lithography pitches may be obtained by the technique illustrated in FIGS. 8, 9 and 10.

Figure 8:
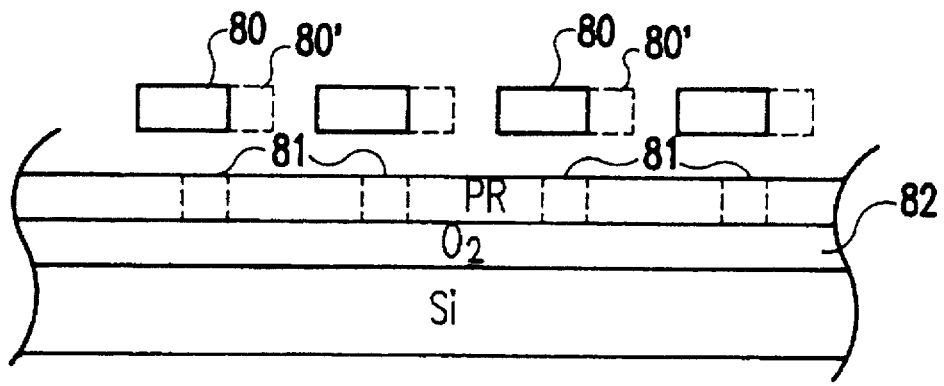
Figure 9:
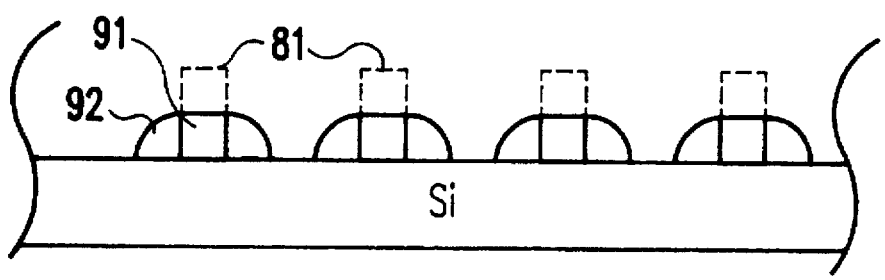
Figure 10:
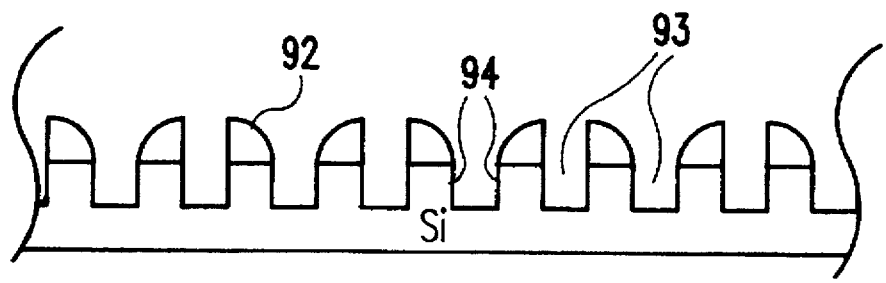

Specifically, as shown in FIG. 8, photoresist layer PR is first exposed with a mask at position 80. The mask is then shifted by a sub-lithographic distance, preferably approximating one-half of the dimension of an exposed area, and a second exposure made. As shown in FIG. 9, this double exposure leaves only areas 81 of sub-lithographic width unexposed and which will remain after development of the resist. The oxide layer 82 is then etched in accordance with remaining resist areas 81 to leave regions 91. The resist 81 is then stripped and nitride spacers 92 formed on the sides of the oxide by any known technique such as isotropic deposition of a blanket layer followed by an anisotropic etch. The oxide is then selectively etched out and the remaining spacers 92 used as a mask to etch grooves 93 in the silicon layer Si leaving mesas 94 when the nitride spacers are removed, as shown in FIG. 10.

This technique thus allows doubling the periodicity of the micro-mesa features relative to the periodicity of the lithographic mask and allows a pitch of 50 nm and a mesa width of 25 nm to be obtained with commonly used lithographic illumination wavelengths for greatly improved current drive in either a corner dominated conduction mode or a fully depleted mesa conduction mode as well as reduction of the overall size of the device for high integration density. Although not shown in FIGS. 5–10, a gate oxide can then be grown or deposited and the gate electrode applied by conventional methods in substantially the form shown in FIG. 2.

Figure 11:
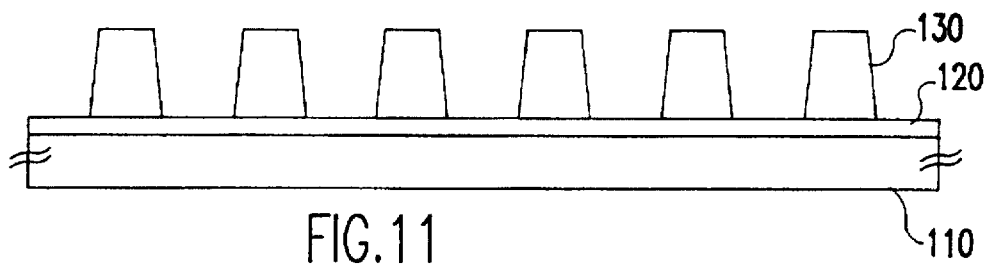
FIGS. 11, 12 and 13 illustrate a fabrication method for a recessed mesa embodiment of the invention.
Figure 12:
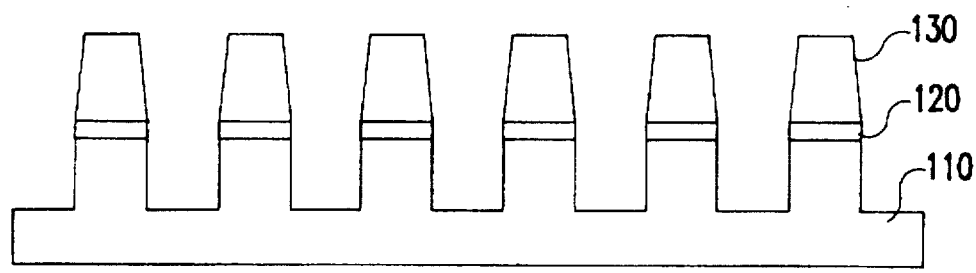
Figure 13:
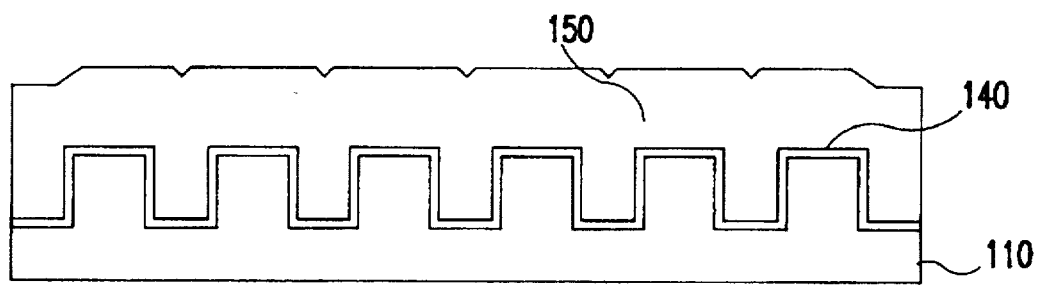

Referring now to FIGS. 11–13, fabrication of an embodiment of the invention having recessed mesas will now be discussed. As shown in FIG. 11, an oxide (or other dielectric which can be selectively etched) layer 120 is deposited or grown to a preferred thickness in the range of 50 nm to 300 nm on silicon (or other semiconductor material) substrate or layer that will form the conduction region of the transistor. A resist 130 is then applied and patterned in accordance with any known technique but preferably using an exposure in accordance with those described above with reference to FIGS. 5–10 for highest resolution and consequent greatest improvement in performance of the transistor. The resist can be any conventional resist having good adhesion and providing adequate resolution. However, best results will be obtained from resists which can be applied in a thin layer since resolution is improved if the resist feature is of low aspect ratio or height. For example, a so-called top surface image resist which can be developed with a dry development technique is somewhat preferred. Silation can be performed on exposed areas of this type of resist to add silicon and increase hardness. Development removes non-silicon material and silicon becomes the mask.

After resist patterning, a "soft" dry etch or a so-called downstream plasma etch in which the substrate is not located in the RF field, yielding a lower particle energy, decreasing directionality of the etch and avoiding damage to the surface, is carried out to define the grating pattern on the substrate or layer forming the conduction region of the transistor. These etching techniques are preferred in order to prevent excessive ion damage to the gate area. The etch depth is chosen to be proportional to the pitch of the grating or the width of the mesas in accordance with the electron density profile which can be obtained with the gate configuration surrounding a portion of each mesa, as will be discussed below with reference to FIG. 20. Generally, however, a high aspect ratio of the height to width of the mesas for increased transconductance is desirable but may be limited by device structural integrity and filling capability of subsequent processes. It should also be understood that this process can be carried out over the entire surface of the wafer or designated relatively large regions thereof. the remainder of the fabrication of the transistor need not be done immediately and significant economic benefit may be derived from optimizing equipment to form wafers with pre-patterned gratings and forming transistors in accordance with the invention starting with such a wafer (e.g. as procured from a wafer manufacturer) having a pre-patterned grating.

After the resist is stripped, a thin gate dielectric 140 such as thermal oxide, CVD oxide or oxynitride is formed by oxidation or deposition and a gate conductive material 150 such as CVD polysilicon, CVD tungsten or any other mid-gap material, as defined above, depending on the work function of the gate, is then deposited. The transistor may then be completed by application of source, gate and drain connections and deposition of a protective or passivation layer (not shown).

Figure 13A:
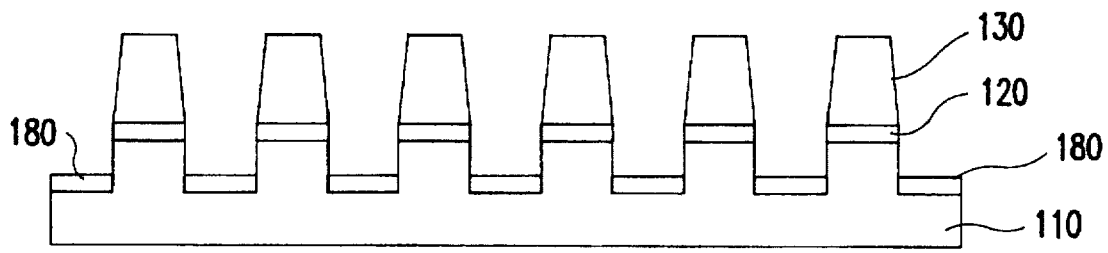
FIGS. 13A and 13B illustrate formation of a variant of the embodiment shown in FIGS. 11–13, FIGS. 14, 15, 16, 17 and 18 illustrate a fabrication method for a further embodiment of the invention, FIGS. 19 and 20 respectively illustrate a simulation of hole and electron concentration contours in a mesa of an FET in accordance with the invention.
Figure 13B:
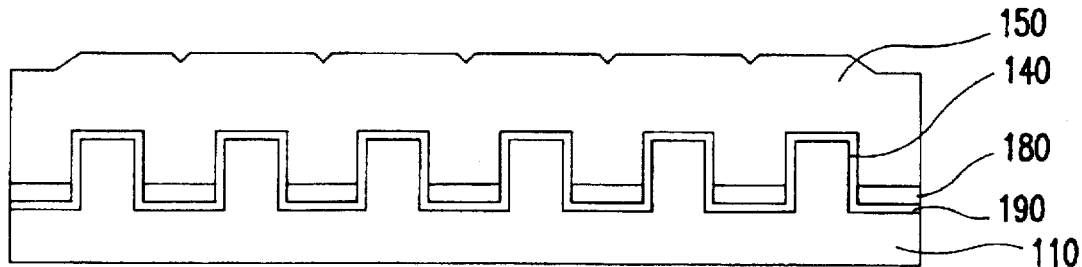

Referring now to FIGS. 13A–13B, formation of an embodiment of the invention by use of liquid phase deposition of inter-mesa oxide will be described. This embodiment of the invention assumes patterning of the silicon layer as described above in connection with FIGS. 11–12 and therefore the structure of FIG. 12 is assumed as a starting point for this embodiment of the invention. In this case, before the resist 130 is stripped, an additional thickness of oxide 180 or other dielectric is selectively deposited, preferably from a liquid phase saturated solution of silica in hydrofluorosilicic acid at room temperature, in a generally anisotropic manner between the mesas. The thickness of the deposit is well-controlled since deposition rate is temperature dependent and will proceed at room temperature at the rate of about 20 nm per hour. Deposition occurs only on exposed (e.g. horizontal) silicon surfaces and not on the resist After the resist 130 and nitride or other material which may be etched selectively as to oxide 120 on the top of the mesas is stripped by known processes, thermal oxidation is performed to grow a thermal oxide gate insulator 190. It should be noted that the thermal oxide grows at the interface between the silicon and the oxide deposited from liquid phase and thereby improves the quality of the interface. The thermal treatment during growth of the thermal oxide also densifies the deposited oxide which improves dielectric qualities and reduces volume of the deposited oxide. This process relieves stresses in the deposited oxide and the overall device structure, particularly as compared to conventional thermal or CVD oxide. Of course, while deposition of oxide from the liquid phase is preferred and provides optimum stress relief in the embodiment and of the dimensions described, other selective insulator deposition techniques are also applicable to this embodiment of the invention.

Figure 14:
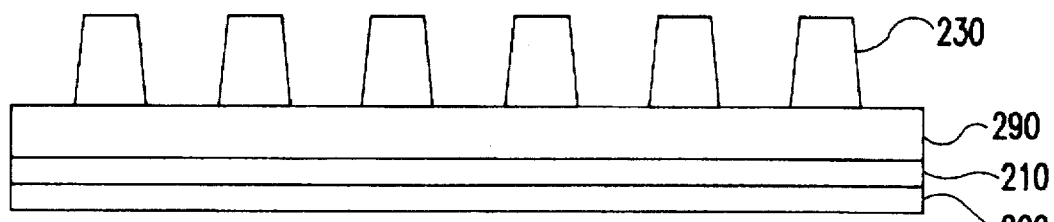

Referring now to FIGS. 14–18, fabrication of another embodiment of the invention by selective epitaxy will now be described. As shown in FIG. 14, a layer of oxide 210 and nitride 290 are sequentially deposited, preferably by chemical vapor deposition, on substrate 200. The thickness of the deposited oxide layer 210 should be determined in accordance with the total desired final thickness of oxide between mesas as described above in connection with FIGS. 3, 4, 13A and 13B. The thickness of the nitride layer 290 determines the height of the mesa sidewall. These layers are followed by a resist 230 which is patterned in any known manner but preferably as described above.

Figure 15:
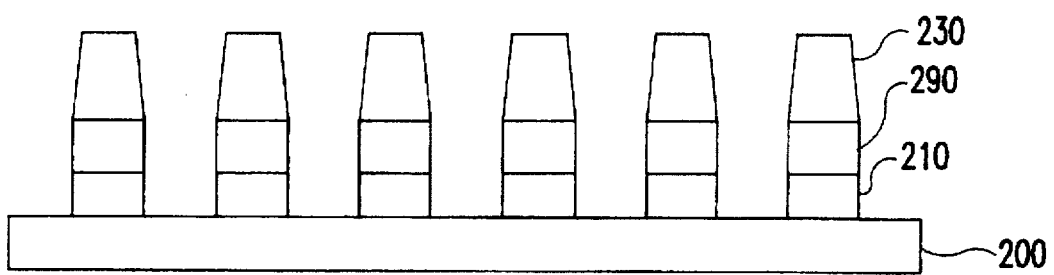
Figure 16:
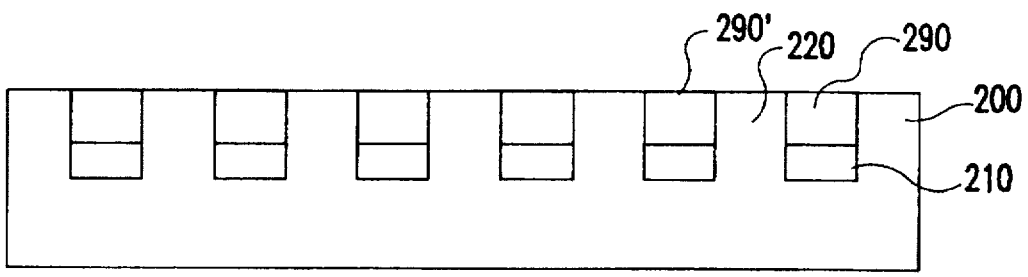
Figure 17:
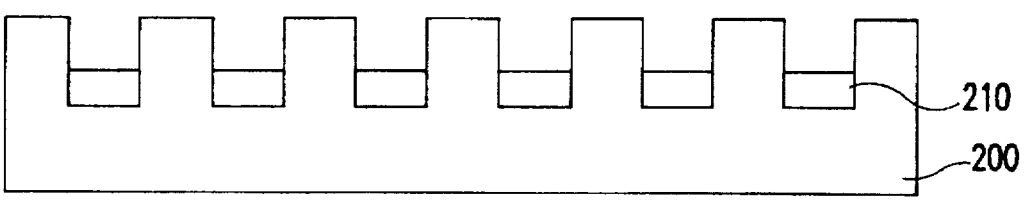
Figure 18:
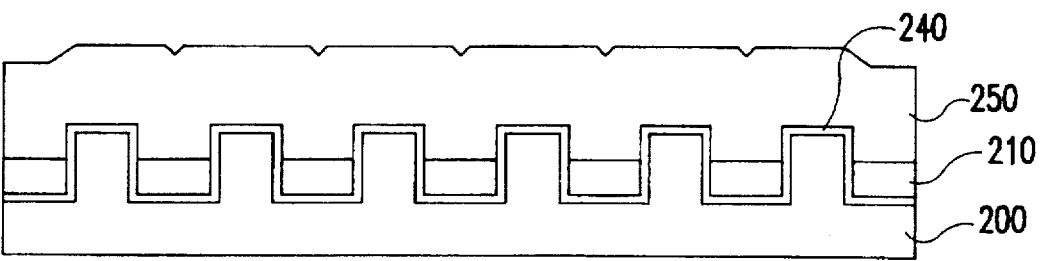

After the resist is patterned, the oxide and nitride layers are patterned, preferably by RIE using $CF_4/O_2$ plasma to substrate 200, as shown in FIG. 15. Of course, as described above, so-called downstream plasma techniques are preferred to minimize damage to the substrate. Then, as shown in FIG. 16, the resist is then stripped and silicon 220 is selectively grown on the exposed substrate silicon between the areas covered with dielectric by known selective epitaxy processes. It is preferable to "overgrow" the silicon and remove the excess by polishing to the hard nitride surface 290' to ensure planarity and height of the mesa surfaces. The nitride 290 can then be removed, as shown in FIG. 17, preferably by a wet or dry selective etch which will not etch either silicon or oxide, thus allowing the oxide to function as an etch stop. The remainder of the process is similar to that described above, resulting in the structure shown in FIG. 18 which is substantially identical to that of FIGS. 4 and 13 (or FIG. 3 if oxide 210 is very thin and is fully converted to thermal oxide by heat treatment).

Having described the geometry of the multi-mesa transistor in accordance with the invention and a plurality of practical techniques for its manufacture, the electrical characteristics of the device will now be described with reference to FIGS. 19 and 20 which are the results of comparative simulations of the transistor in accordance with the invention and a current and feasible field effect transistor design which is of similar proportions but lacks the multi-mesa configuration of the conduction region. Effective channel length, Leff=0.224 μm and Tox=8.2 nm have been assumed. A 1.0 V power supply has also been assumed in order for the results to be relevant to very low voltage operation. The total gated area including the surfaces and sidewalls of the mesas was set equal to the width of the current transistor design (although it should be noted that the corresponding chip space would be much smaller for the transistor of the invention). For equal mesa widths and spaces (i.e. grooves), this constrains the gated mesa height to one-half the mesa width (although, as alluded to above, taller mesas would result in higher transconductance).

Mesa doping was assumed such that the off-current of the two transistors would be equal. To ensure full depletion of the mesas while meeting a low standby power/off current of approximately 0.4 pA/μm, a mid gap work function material was assumed for the gate of the multi-mesa transistor. An N+ polysilicon gate conductor is conventional in planar MOSFETs and was assumed for the conventional FET in this simulation since a mid-gap material in a conventional MOSFET design would raise Vt, contrary to the purposes of the invention. As with SOI, full depletion provides very significant performance advantages and it has been found that a very light doping concentration of $10^{16}/cm^3$ (p-type) is required to provide an off current comparable to the current FET design used in the comparison.

Figure 19:
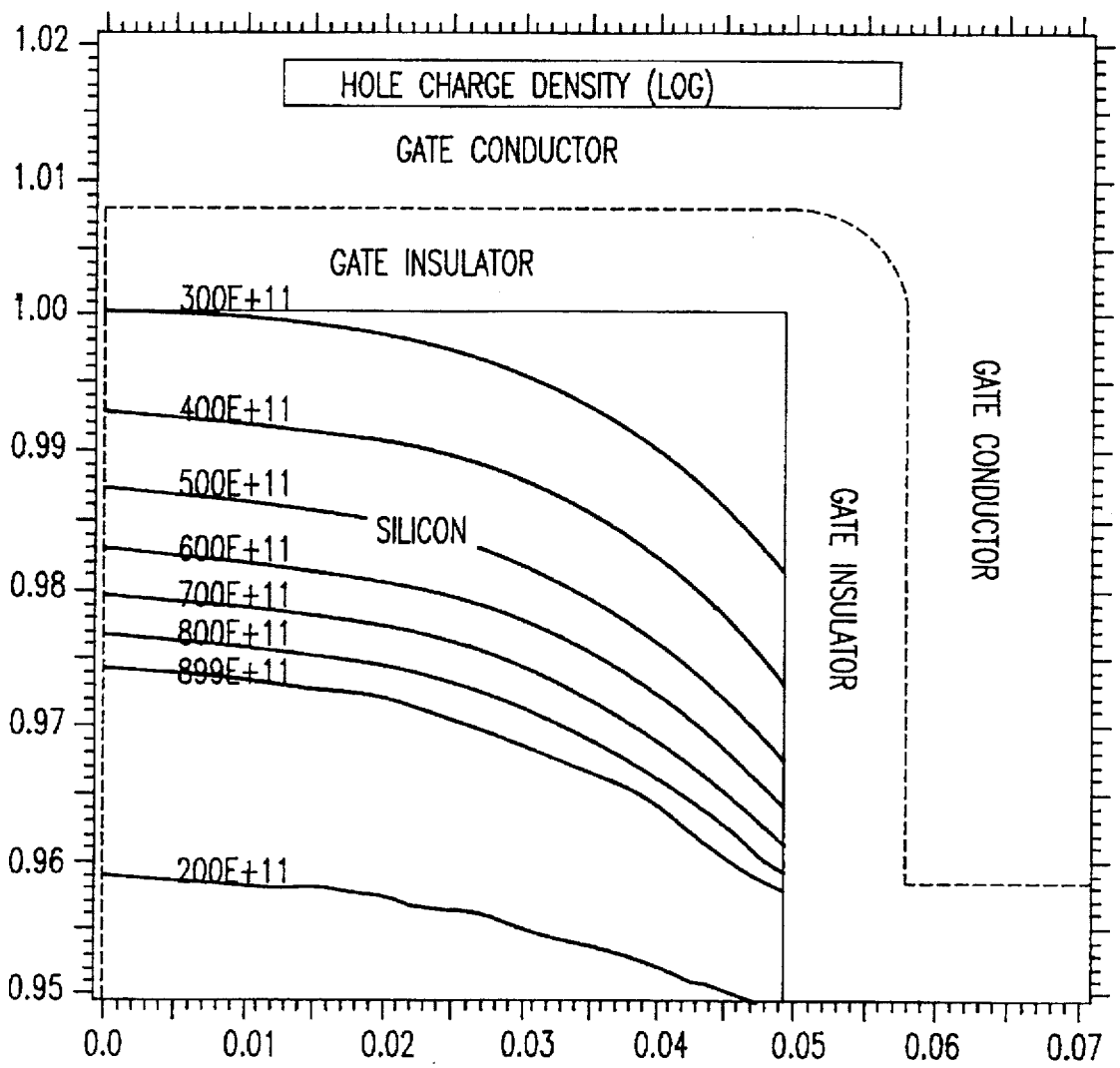

FIG. 19 shows a simulation of the loci of equiconcentration hole profiles within one half of a micro-mesa under the above conditions for this simulation for zero gate voltage. It is apparent that full depletion is achieved at zero gate voltage since the highest hole concentration is approximately five orders of magnitude below the mesa doping concentration. This is in sharp contrast with the transistor described in the above-cited IBM TDB which does not seek full depletion but strong corner conduction. It should also be noted that this full depletion is difficult to achieve at a mesa width greater than one-quarter micron. Additionally, the current component attributable to corner conduction effects will not be particularly significant in a transistor suitable for high integration density at a grating pitch of more than one-half micron, corresponding to a one-quarter micron mesa width, since a larger pitch would reduce the number of corners which could be included in the transistor. Therefore, a one-quarter micron mesa width is considered to be the largest mesa width suitable for practice of the invention.

Figure 20:
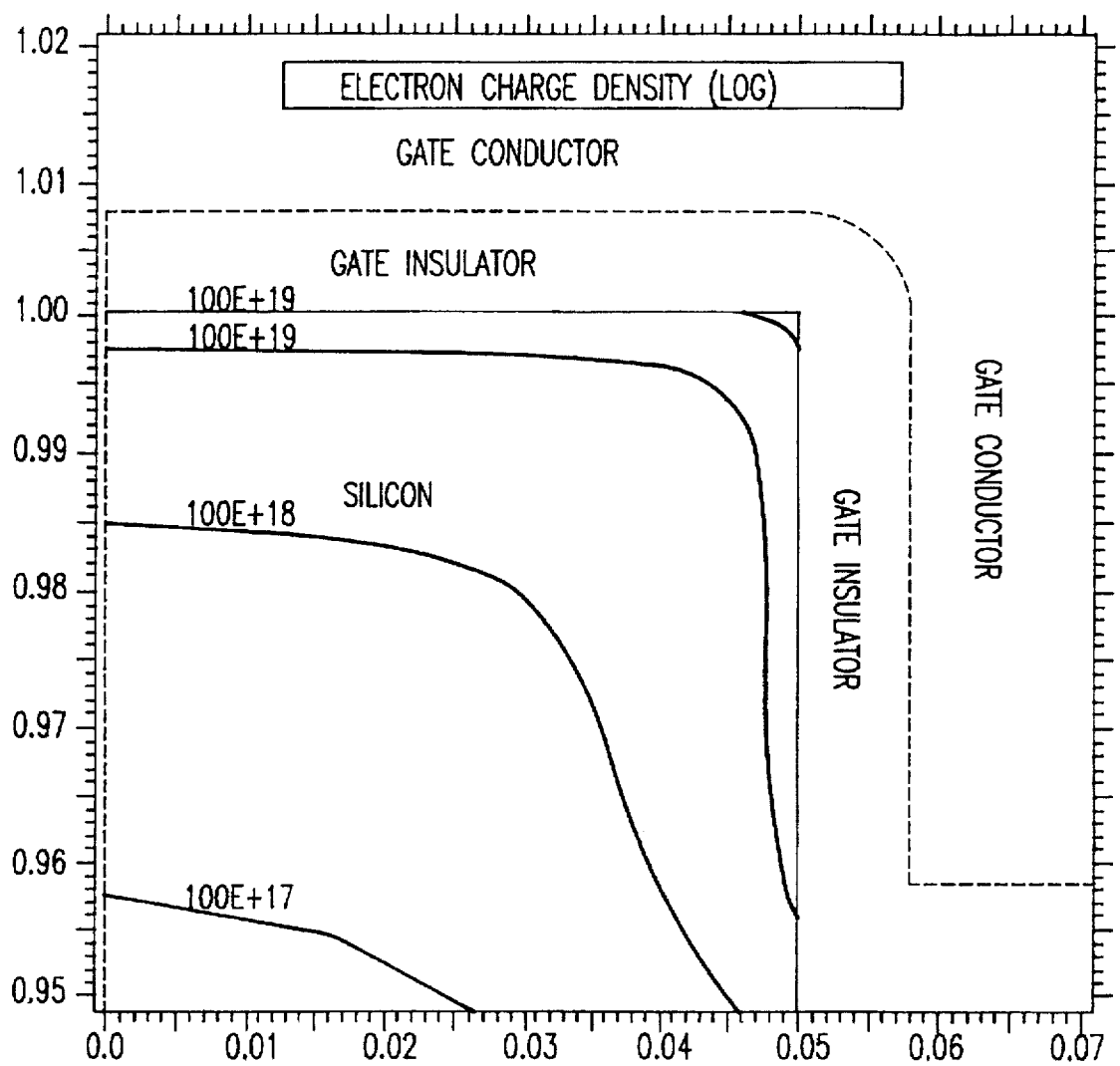

FIG. 20 shows electron concentration contours midway between the source and drain for an on-condition gate voltage Vg=Vd=1.0 V. It should be noted that significant inversion occurs throughout the mesa and the transistor in accordance with the invention is seen to operate more as a bulk inversion device than a common CMOS transistor.

Figure 21:
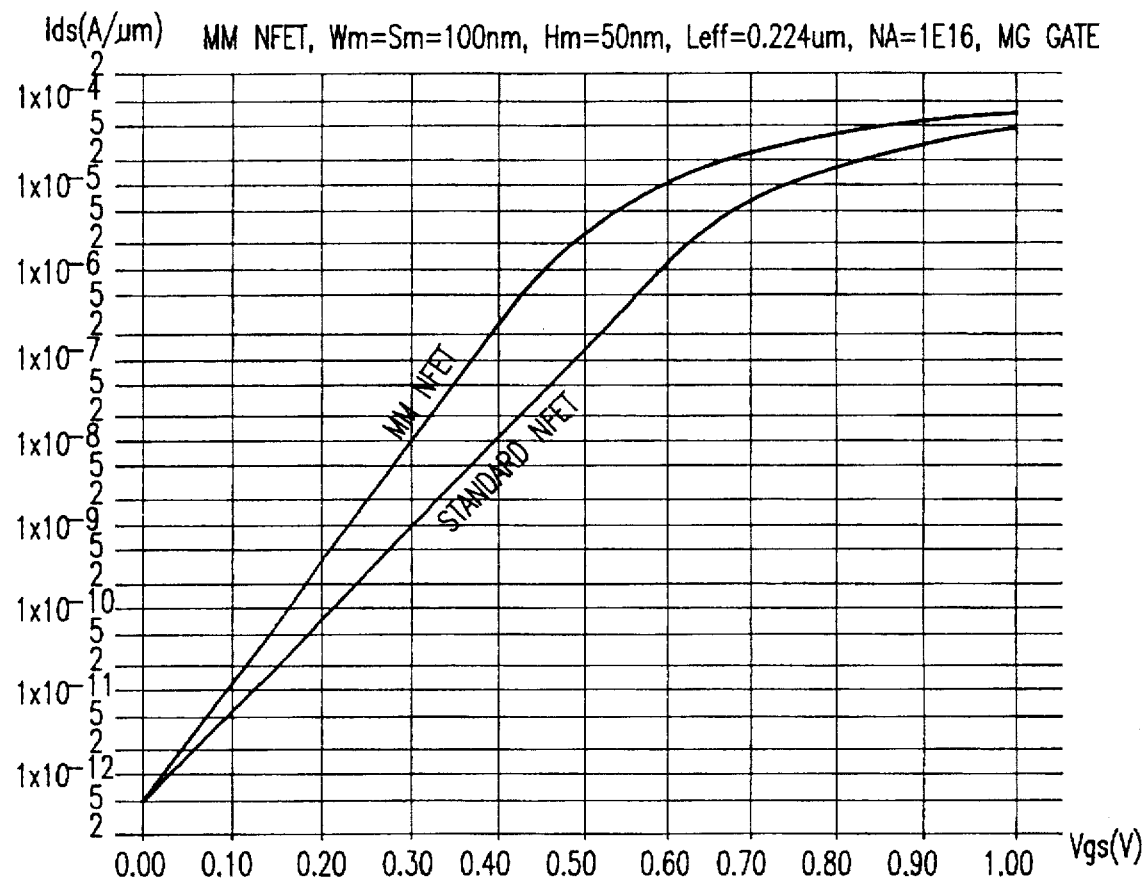
FIG. 21 illustrates a comparison of the Id-Vg characteristics of the invention and an FET of conventional design.

FIG. 21 shows a comparison of the Id-Vg characteristics of the two transistors described above. While the off-currents are constrained to be equal, as discussed above, the saturated on-current of the multi-mesa transistor in accordance with the invention is approximately 81% greater than the conventional device. To understand the magnitude of this improvement, such a current increase corresponds to approximately a 45% reduction in switching time for transistors driving equal loads and approximately doubles fan-out (e.g. the number of devices, transistors or other similar loads which can be driven. Particularly when it is considered that the multi-mesa transistor in accordance with the invention has a much reduced "footprint" in comparison with the known design and that such a reduction of "footprint" in the known design would cause substantial degrading of performance, especially at very low voltage operation, the advantages realized by the present invention are clear and unexpected in degree.

Upon further analysis of the comparative characteristics shown in FIGS. 19–21, it may be seen that these advantages are due to the simultaneous improvement of several factors. Specifically, the present invention exhibits a steeper sub-Vt slope of 70 mV/decade (e.g. one order of magnitude per 70 mV) as compared with 88 mV/decade for the standard device. The transistor in accordance with the invention also exhibits lower substrate sensitivity of 40 mV/V, in contrast with 291 mV/V for the standard device. This translates to higher pinch-off voltage and, hence, higher saturated on-current. Further, higher electron and hole mobility results from a reduced electric field normal to the gated surface; resulting in much reduced surface scattering.

As an additional and expected advantage of the invention, the multi-mesa device also exhibits a low sensitivity to geometric variations. For example, the short channel roll-off is improved (32 mV vs 50 mV between Leff=1.0 m and Leff=0.224 µm at Vd=1.0 V) and Vt drops by only 9 mV when the mesa width is reduced from 100 nm to 50 nm (e.g. approximately halved in the regime of interest, although this relationship is non-linear). Since the mesa doping is so light, the bulk charge term in the threshold equation contributes only negligibly to Vt and therefore it is also to be expected that the invention will exhibit a low sensitivity to doping concentration variations. These low sensitivities to geometrical and mesa dopant concentration variation, of course, translate into wide manufacturing process tolerances and high device yield as well as uniformity of performance from wafer to wafer.

Gate capacitance has been evaluated and the approximate equality of gate capacitances of the simulated transistors confirms the validity of the simulation. Also, as a figure of merit, an improvement of 81% in $Id_{sat}/C_{in}$ (saturation current per unit of input capacitance) is achieved for equal gated areas.

Additionally, in comparison with the multi-mesa device described in the above-cited IBM TDB, the present invention avoids complex, non-cost effective processes while allowing the device to be manufactured with sub-lithographic mesas and at extremely high integration density without compromising manufacturing yields, particularly since the invention can be fabricated using only known processes implemented by the techniques described above in connection with FIGS. 5–10. Compared with that device, a significant reduction of input capacitance is also achieved. A more presently useful Vt is achieved through a lower dopant concentration and mid-gap gate conductor material.

From the foregoing, it is seen that the invention, in comparison with other technologies, achieves SOI-like performance without floating body effects or back interfacial leakage and can be fabricated using much less expensive conventional silicon wafers as well as being ideally suited to very low voltage operation. Both the device and the manufacturing methods described above are fully applicable to all Group III–V semiconductor materials. Additionally, there is no penalty in gate capacitance and the processes involved in the production of the present invention integrate well with other CMOS processes; differing principally by the initial formation of the grating which can be limited with low resolution block-out masking. However, if no conventional CMOS transistors are required, manufacturing processes optimized to provide gratings over the entirety of wafer surfaces can be used to provide a supply of wafers with preformed gratings thereon; permitting the practice of the invention with further increased economy and manufacturing yield.

In the interest of completeness, a further fabrication method including a process of forming source and drain structures for a transistor in accordance with the invention will be described in connection with FIGS. 22–29. It is to be understood that the formation of connections described here is also applicable to any of the above-described fabrication methodologies.

Figure 22A:
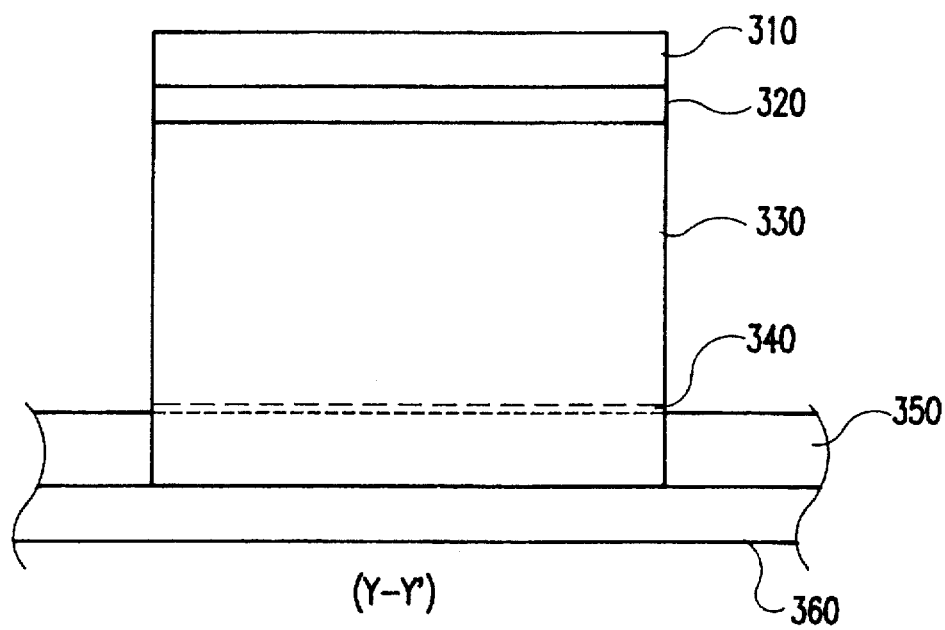
Figure 22:
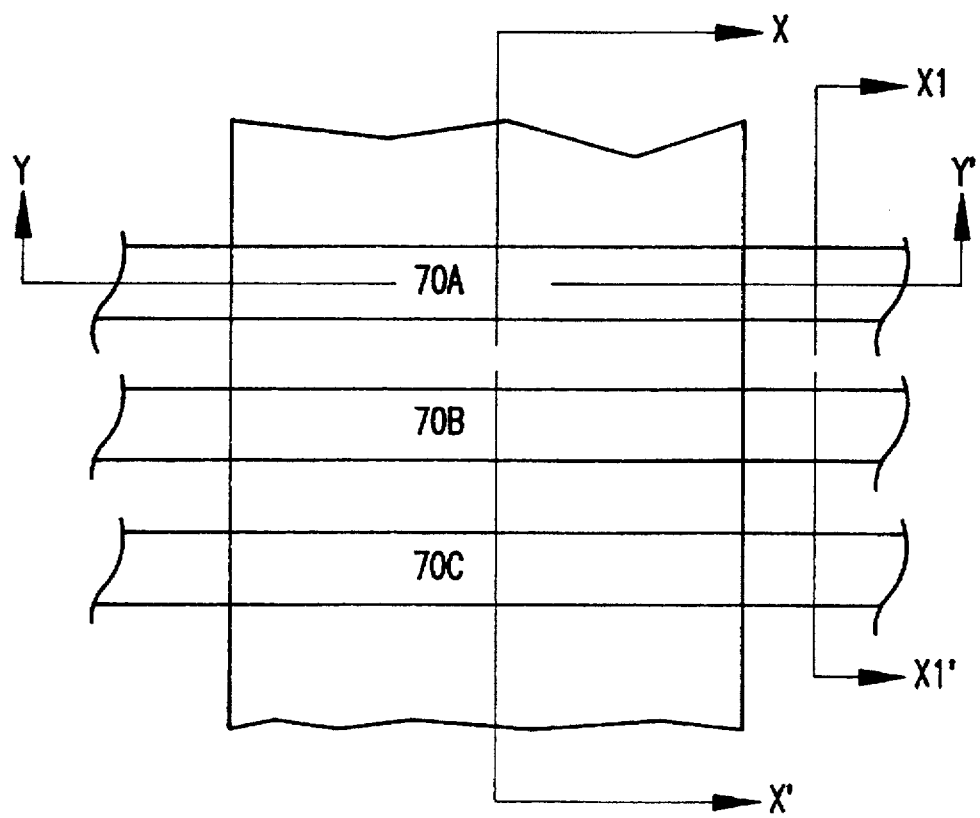

Specifically, FIG. 22 is a plan view of a central portion of a transistor in accordance with the invention and as shown in FIG. 1, but having the gate electrode running vertically on the page. The X–X' section indicated in FIG. 22 and shown in FIG. 22C thus corresponds to the cross-section through the conduction channel under the gate stack shown along section Y–Y' in FIG. 22A while the X1–X1' section, shown in FIG. 22B corresponds to the cross-section taken through the source or drain region. All of the following Figures are principally concerned with processes best observed in cross-sections corresponding to sections Y–Y' and X–X1' and with regions at or above the level of the micro-mesas, formed as previously described.

The preferred form of gate stack in accordance with the invention, shown in FIG. 22A, includes an oxide layer (about 300 angstroms) 310, a nitride layer (about 250 Angstroms) 320, CVD polysilicon (about 1200 angstroms) 330, thin gate dielectric 340 and buried oxide (of desired thickness) 360 within the channel adjacent the side of the next mesa 350 shown (since the cross-section Y–Y' cuts the inter-mesa region of the gate structure). All of these layers are formed and patterned by conventional means and methodologies which are unimportant to the practice of the invention.

Referring now to FIGS. 23A and 23B, $CF_4$ plasma is preferably used to etch the gate stack oxide and the buried oxide protruding therefrom in grooves 350. The buried oxide under the gate stack, of course, is unaffected. Then, a thin thermal oxide (not shown) is grown on the periphery of the gate stack and drain diffusion extension (or a lightly doped drain (LDD) implant) is done as shown in FIGS. 24A and 24B which forms source and drain profiles 455 and 450, respectively. A slightly non-uniform profile 440 is expected to result from the non-planar surface presented by the grooves but is not important to the practice of the invention.

Then, as shown in FIGS. 25A and 25B, nitride sidewall spacers 460 are formed on the ends of the gate stack over portions of the source and drain regions S and D. Nitride from this deposition will fill the trenches since the trench width is preferably less than half of the nitride spacer thickness, as shown at 470. As shown at FIG. 26, a second sidewall 480, preferably of CVD oxide about 200 angstroms thick, is then formed over nitride sidewall 460 by isotropic deposition and anisotropic directional etching. This material does not cover the source/drain area since the grooves are filled with nitride 470 as described above and any oxide in this region is removed by isotropic etching. This allows the nitride in the grooves to be selectively removed, as shown in FIG. 27 in a self-aligned manner while the nitride sidewall spacers 460 are protected by the second sidewall oxide 480.

Then, as shown in FIG. 28, the oxide second sidewall 480 can be selectively removed by known processes while the gate stack is protected by the top nitride 320. Finally, a further implantation and silicidation are conducted to form source and drain profiles as shown at FIGS. 29A and 29B. These profiles, although slightly changed in appearance in conventional FETs perform in much the same fashion as known LDD structures with the improved performance characteristics in regard to so-called short channel, hot carrier and other effects which are thus engendered in the high-performance transistor in accordance with the invention, notwithstanding the sub-lithographic sized features thereof while known techniques of forming these structures rely largely on lithographic techniques.

In view of the foregoing, it is seen that a high performance field effect transistor has been provided by the invention which can be fabricated at high yields at sub-lithographic sizes and ideally suited for operation in very low voltage regimes. Known performance-enhancing structures such as lightly doped drains may also be achieved by self-aligned techniques at sub-lithographic dimensions.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A field effect transistor having a conduction region including a plurality of mesa structures, said mesa structures being formed at a pitch of less than one-half micron and a width of less than one-quarter micron by etching and doped to an impurity concentration to operate in a fully depleted mode.

2. A field effect transistor as recited in claim 1, including a gated area on at least a portion of at least one side of at least one mesa.

3. A field effect transistor as recited in claim 1, wherein said plurality of mesa structures are formed by recesses in a semiconductor wafer.

4. A field effect transistor as recited in claim 1, further including an deposited oxide dielectric only between said mesa structures.

5. A field effect transistor as recited in claim 4, wherein said oxide dielectric is deposited from liquid phase solution.

6. A field effect transistor as recited in claim 5, wherein said oxide is deposited at approximately room temperature.

7. A field effect transistor as recited in claim 6, further including a thermal oxide grown on and between said mesa structures.

8. A field effect transistor as recited in claim 2, wherein said mesas are epitaxially grown semiconductor.

9. A field effect transistor as recited in claim 8, further including an oxide dielectric between said mesa structures.

10. A field effect transistor as recited in claim 9, further including a thermal oxide grown on and between said mesa structures.

11. A field effect transistor as recited in claim 2, further including a lightly doped drain structure.

12. A method of making a field effect transistor including the steps of exposing a pattern on lines on a lithographic resist, said pattern of lines having a pitch which is less than one-half micron, etching grooves of sub-lithographic width in accordance with said exposure of said resist, forming a grooved surface including mesa structures, forming an oxide on said grooved surface, and applying a gate electrode over said oxide.

13. A method as recited in claim 12, wherein said pattern of lines has a pitch which is less than a wavelength of radiation used for said exposure step.

14. A method as recited in claim 12, including the further step of depositing a dielectric between said mesa structures.

15. A method as recited in claim 14, wherein said dielectric is an oxide.

16. A method as recited in claim 15, wherein said oxide is deposited from liquid phase solution.

17. A method as recited in claim 16, wherein said depositing step is performed at room temperature.

18. A method as recited in claim 12, including the further step of forming a thermal oxide on said grooved surface.

19. A method as recited in claim 17, including the further step of forming a thermal oxide on said grooved surface.

20. A method as recited in claim 12, wherein said exposing step includes the steps of depositing a layer of material prior to said resist, making a first lithographic exposure of said resist through a lithographic mask, shifting said mask by a sub-lithographic distance, and making a second lithographic exposure of said resist, and including the further step of etching said layer of material in accordance with said first and second exposures.

21. A method as recited in claim 20, comprising the further steps of forming sidewalls on remaining portions of said material, removing said portion of said layer of material to form a mask, and performing said etching step in accordance with said mask.

22. A method as recited in claim 12, wherein said exposing step includes the step of forming an interference pattern with said radiation.

23. A method as recited in claim 22, wherein said interference pattern is developed with a strong phase shift mask.

24. A method as recited in claim 22, wherein said interference pattern is derived by off-axis illumination through a grating pattern.

25. A method as recited in claim 22, wherein said interference pattern is derived by illuminating said resist from two radiation sources having the same radiation wavelength and having said radiation directed at said resist from a shallow angle.

26. A semiconductor wafer having a region of a surface patterned with a plurality of elongated features which have a width less than or equal to one-quarter micron and a pitch less than or equal to one-half micron.

27. A method of making a semiconductor wafer including the steps of depositing a layer of material, depositing a resist, making a first lithographic exposure of said resist through a lithographic mask, shifting said mask by a sub-lithographic distance, making a second lithographic exposure of said resist, and etching said layer of material in accordance with said first and second exposures.

28. A method of making a semiconductor wafer including the steps of applying a resist to a surface of said semiconductor wafer, exposing said resist with a pattern of radiation to form a pattern of elongated features at a pitch which is less than one-half micron, and etching said surface in accordance with said pattern.

29. A method as recited in claim 28, wherein said exposing step includes the further step of forming an interference pattern of said radiation such that said pitch is less than a wavelength of said radiation.

30. A method as recited in claim 29, wherein said interference pattern is developed with a strong phase shift mask.

31. A method as recited in claim 29, wherein said interference pattern is derived by off-axis illumination through a grating pattern.

32. A method as recited in claim 29, wherein said interference pattern is derived by illuminating said resist from two radiation sources having the same radiation wavelength and having said radiation directed at said resist from a shallow angle.

* * * * *